United States Patent [19]

LaGrange et al.

[11] 3,895,181

[45] July 15, 1975

[54] ARRANGEMENT FOR CONNECTING ELECTRICAL CIRCUITS

[75] Inventors: Jean-Paul LaGrange, Paris; Gérald Davy, Noisy-Le-Roi; Jean-Claude Prouin, Neuilly-Marne; Bernard Le Govic, Sarcelles; Jean Sandoz, Paris, all of France

[73] Assignee: Honeywell Information Systems Inc., Waltham, Mass.

[22] Filed: Aug. 21, 1974

[21] Appl. No.: 499,384

[30] Foreign Application Priority Data

Sept. 12, 1973 France .............................. 73.32827

[52] U.S. Cl....... 174/68.5; 317/101 B; 317/101 CM; 339/18 R

[51] Int. Cl.$^{2}$ ............................................ H05K 1/02

[58] Field of Search........................ 174/68.5, 32, 34; 317/101 CE, 101 CC, 101 B; 339/18 R, 18 C, 18 B

[56] References Cited

UNITED STATES PATENTS

| | | | |
|---|---|---|---|
| 3,193,731 | 7/1965 | Gerlach et al. | 317/101 CE |
| 3,312,871 | 4/1967 | Seki et al. | 317/101 CE UX |
| 3,564,114 | 2/1971 | Blinder et al. | 174/68.5 |

*Primary Examiner*—Darrell L. Clay
*Attorney, Agent, or Firm*—David A. Frank; Ronald T. Reiling

[57] ABSTRACT

An improved arrangement for connecting electrical circuits is formed by a plurality of superimposed insulating sheets joined together. At least one face of each of the sheets carries networks of conductive strips. The arrangement concludes linking members for electrically coupling conductive strips situated at different ones of said sheets and connecting members which connect the strips to the electrical circuits. The linking and connecting members are arranged in rows and columns defining corridors through which must pass the conductive strips. The general directions of the conductive strips are parallel to each other and to the corridors. At least one strip out of two is in the form of an offset line such that the average distance between two adjacent strips along their substantially parallel paths is greater than the distance which would separate them if they were entirely straight.

3 Claims, 7 Drawing Figures

ARRANGEMENT FOR CONNECTING ELECTRICAL CIRCUITS

BACKGROUND OF THE INVENTION

1. Field of the Invention

The present invention relates generally to arrangements for connecting electrical circuits and more specifically to connection arrangements on a plurality of superimposed sheets.

2. Description of the Prior Art

Arrangements for connecting electrical circuits are known which are formed by a plurality of superimposed insulating sheets which are joined together. The faces of these sheets carry networks of conductive strips. These known arrangements incorporate linking members, such as metal-lined holes or metal pillars, which pass through the sheets and which enable conductive strips situated at different levels to be linked electrically. In order that certain points along the conductive strips may be linked to the electrical circuits, connecting members are provided within the connecting arrangement. The connecting members are linked to the conductive strips. The connecting members may be metal-lined holes or connector contacts. The connecting terminals from the circuits are soldered into or onto the connecting members.

For the purposes of simplification and standardization, the connecting members are generally arranged in rows and columns forming a grid having square or rectangular lattices. The linking members are also laid out in rows and columns. As an example, the rows of connecting members and linking members may coincide and each linking member in a row may be arranged half-way between two connecting members. However, since there is very often no necessity for there to be as many linking members as there are connecting members, it is sufficient to arrange one linking member between two connecting members in every other interval between connecting members. The linking members are preferably staggered from one line to the next in such a way that the linking members in one line are opposite unoccupied intervals between pairs of connecting members in the other.

The conductive strips in the connecting arrangement include sections parallel to the rows and columns which pass between the linking members and the connecting members. The rows and columns of connecting and linking members could be said to define orthogonal corridors. The conductive strips pass through these corridors.

In order that the largest possible number of electrical circuits may be interconnected, the number of conductive strips must be very great. However, the number in question is restricted by the narrowness of the corridors. In effect, strips which are parallel to each other are too close together which causes cross-talk phenomena to occur. The result is that only a limited number of conductive strips can pass through each corridor and that, therefore, the connecting capacity of such arrangements can only be increased by increasing the number of superimposed sheets. However, this is a cumbersome solution complicated by the connections between different levels.

OBJECTS OF THE INVENTION

It is an object of the present invention therefore to provide an improved arrangement for connecting electrical circuits.

It is another object of the invention to provide an improved electrical connection arrangement which allows a large number of electrical circuits to be interconnected.

It is another object of the present invention to provide an improved arrangement for connecting electrical circuits which allows a large number of conductive strips to pass through small corridors without undesirable levels of cross-talk resulting.

Other objects and advantages of the invention will become apparent from the following description of the preferred embodiment of the invention when read in conjunction with the drawings contained herewith.

SUMMARY OF THE INVENTION

The arrangement for connecting electrical circuits is formed by a plurality of superimposed insulating sheets. The sheets are joined together and the faces of the sheets carry networks of conductive strips. The arrangement incorporates linking members which enable the conductive strips situated at different levels to be electrically linked. Connecting members enable certain points along the strips to be connected to the electrical circuits. The linking and connecting members are laid out in rows and columns which, in the case of at least certain sheets, define corridors through which must pass the conductive strips. The general directions of the conductive strips are parallel to each other and to the corridors. At least one strip out of two is in the form of an offset line such that the average distance between two adjacent strips along their substantially parallel paths is greater than the distance which would separate them if they were straight.

The connecting members are arranged in rows and in columns forming a grid having rectangular lattices. The distance between two columns is greater than that between two rows. The linking members are in a row; they are arranged between two connecting members such that they are in every other interval between connecting members. It is advantageous for two strips to pass through each corridor parallel to the rows. Each strip forms an offset line. Each line is situated positioned away from the other when it is opposite an interval between connecting members where there is no linking member.

It is also advantageous for two strips to pass through each corridor parallel to the columns. The strip nearer a column of connecting members may be straight while the strip nearer a column of linking members is in the form of an offset line. In the latter case, it is possible for short straight strips to be provided between two consecutive linking members, provided that the length of the offsets is less than the distance separating two linking members in a direction parallel to the columns.

The paths of the straight and offset strips in the network may advantageously be calculated by an electronic computer which has access to the appropriate rules governing the lay-out of the paths in accordance with the invention. When the computer is given an outline of the circuit showing only straight strips, it will yield the desired circuit in the modified format, i.e., utilizing the improved arrangement.

BRIEF DESCRIPTION OF THE DRAWINGS

In these Figures, the same reference numerals refer to similar parts.

DESCRIPTION OF THE PREFERRED EMBODIMENT

Figure 1:
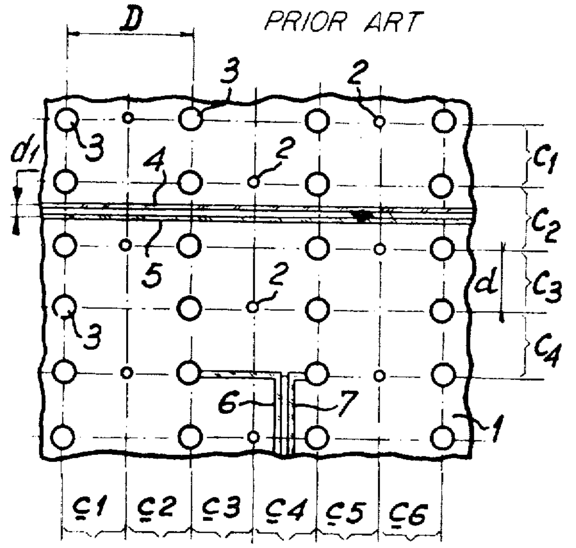
Fig.1 PRIOR ART
FIG. 1 is an example of a known arrangement which suffers from cross-talk between conductors.

The part of an insulating sheet 1 shown in FIG. 1 belongs to a known type of connection arrangement for electrical circuits which consists of a plurality of superimposed insulating sheets which are joined together and carry conductive strips.

In order to link sections of insulating strips which are situated at different levels, (i.e., on different insulating sheets), the arrangement incorporates linking members 2, which may be formed by conductive pillars passing through the sheets. Similarly, to enable certain points along certain conductive strips to be connected to the electrical circuits, the arrangement incorporates connecting members 3, which may for example be formed by metal-lined holes which pass through the sheets and into which are plugged the terminals of the connectors associated with the circuits.

The linking members 2 and connecting members 3 are laid out in rows and columns. In the embodiment shown in FIG. 1, the connecting members 3 form a grid having rectangular lattices. As an example, the distance $d$ between two rows may be 3.175 mm (125 mils) and the distance D between two columns may be 6.35 mm (250 mils).

The linking members 2 are laid out so that in any one row of connecting members 3, they are situated at the middle of every second interval between two connecting members 3. Furthermore, the linking members 2 are staggered from one row to the next in such a way that the linking members in one row are situated opposite intervals in the other row in which there are no linking members.

Thus, for the insulating sheets in the connection arrangement, and in particular for sheet 1, the rows of members 2, 3 define corridors $C_1$, $C_2$, $C_3$, $C_4$ . . . (the width of which is $d$) in which the conductive strips on sheet 1 whose direction is parallel to the rows, must be situated. In the same way, the columns of members 2 and 3 define corridors $c_1$, $c_2$, $c_3$ . . . (the width of each of which is D/2), in which the conductive strips on sheet 1, whose direction is parallel to the columns, must be situated.

In corridor $C_2$ are shown two conductive strips 4, 5 which are parallel to each other and to the rows of members 2, 3. The minimum width of these strips 4, 5 is approximately 0.254 mm (10 mils). In view of the narrowness of the corridor, cross-talk interference occurs between the conductors, 4, 5, the distance between which is only $d_1$.

Similarly, in corridor $c_4$ (between a column of members 2 and a column of members 3) are shown two conductive strips 6, 7 which are parallel to each other and to the columns of members 2, 3. The minimum width of these strips 6, 7 is likewise approximately 0.254 mm (10 mils) and for the same reasons as were mentioned above, cross-talk interference occurs between these conductors 6, 7.

It is therefore essential either to allow only one of the conductive strips 4, 5 (or 6, 7) to pass through each corridor, or else to widen the corridors. In either case the connecting capacity of the arrangement is reduced and it becomes necessary to provide it with additional levels of connection sheets, which increases complexity of the arrangement, particularly as far as the linking members are concerned.

Figure 2:
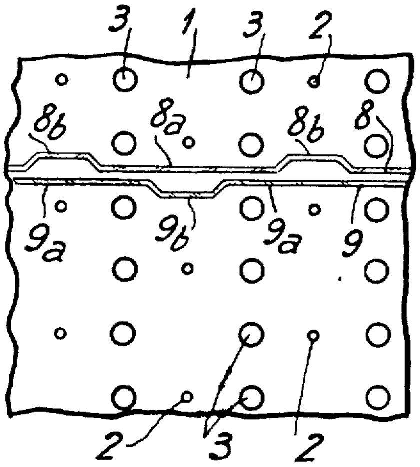
FIG. 2 shows an arrangement according to the invention in which cross-talk is reduced in the case of the conductors parallel to the rows.
Figure 3:
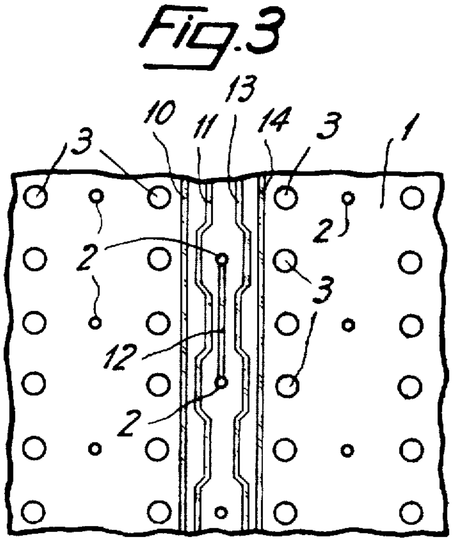
FIG. 3 shows an arrangement according to the invention in which cross-talk is reduced in the case of the conductors parallel to the columns.

FIGS. 2 and 3 show the way in which the invention solves this problem. The invention enables two conductors to be passed through each corridor without widening the corridors.

Referring now to FIG. 2, two conductors 8, 9 extend in directions substantially parallel to the horizontal corridors and pass through one of these corridors (equivalent to corridor $C_2$ in FIG. 2). Each of the conductors 8, 9 takes the form of an offset line. The offsets are of trapezoidal form in this example and consist of straight interior sections 8$a$, 9$a$ and straight marginal sections 8$b$, 9$b$. In relation to the nearest row of members 2, 3, the straight interior portions 8$a$, 9$a$ are situated opposite intervals between connecting members 3 in which a linking member 2 is situated. Conversely, in relation to the nearest row of members 2, 3, the straight marginal sections 8$b$, 9$b$ are situated opposite and partly within the intervals between connecting members 3 which contain no linking members 2. In view of the fact that, from one row of members 2, 3 to the next, the members 2 are staggered by a distance equal to the interval between two members 3, it follows that sections 8$a$ are situated opposite sections 9$b$, while sections 8$b$ are opposite sections 9$a$. Consequently, the conductors 8, 9 form two rows of opposed offsets which are staggered in relation to one another in such a way that an offset in one conductor is situated opposite the region between two offsets in the other. The result is that, although the distance between a section 8$a$ and a section 9$a$ is still the same, $d_1$, as it was in the case of FIG. 1, the average distance between the two conductors 8, 9 is appreciably greater than $d_1$, due to the fact that the conductors are further apart where the straight sections 8$b$, 9$b$ are situated. It is possible in this way to reduce cross-talk phenomena between the conductors 8, 9, the general directions of which are parallel.

In FIG. 3 the conductors 10, 11, 12, 13 and 14, the general directions of which are parallel to corridors $c$, are shown between columns of members 3 and columns of members 2. The conductors 10 to 14 follow paths in two adjacent corridors such as corridors $c_1$ and $c_2$ (or $c_3$ and $c_4$, etc.) in FIG. 1. The conductors 10, 14, each of which is near a column of members 3, are straight, while the conductors 11, 13, which are near a common column of members 2, are formed by offset lines. In this way the average distance between the conductors 10, 11 (or 13, 14) is greter than that between the conductors 6, 7 in FIG. 1, and cross-talk is reduced to a level which is acceptable (bearing in mind the length for which the strips extend.

The conductor 12 is straight and joins together two consecutive linking members 2. The length of the offsets in lines 11 and 13 in a direction parallel to the columns is made smaller than the distance between two linking members 2. Thus, the average distance between each of the conductors 11, 13 and conductor 12 is greater than the least distance between the conductors in question since each of conductors 11, 13 is further from conductor 12 in the neighborhood of linking members 2.

Figure 4:
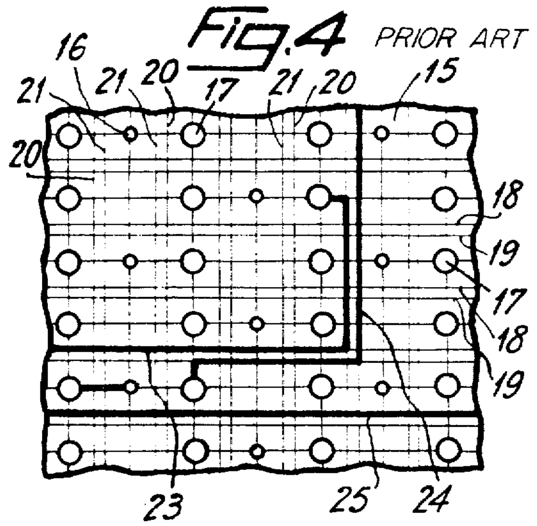
FIG. 4 PRIOR ART
FIG. 4 shows a lay-out for a connection arrangement according to the prior art.

FIG. 4 shows part of a sheet, of paper for example, on which linking members 2 and connecting members 3 are represented by circles 16 and 17 respectively. The straight lines 18, 19, the direction of which is parallel to the rows of circles 16 and 17, are drawn between the latter. In the same way, the straight lines 20, 21, the direction of which is parallel to the columns of circles 16 and 17, are drawn between these columns. Lines 18 to 21 form a grid on which conductors such as 23, 24, 25, etc., may be drawn.

Figure 5:
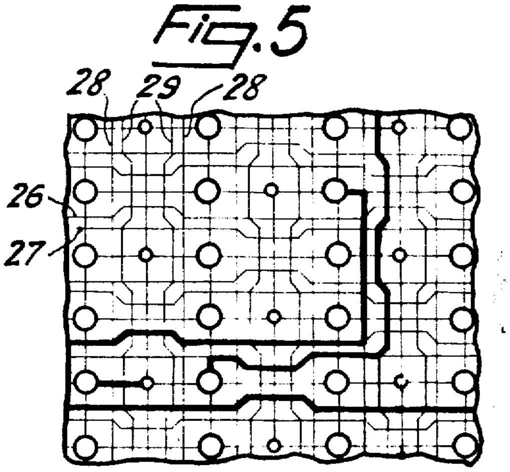
FIG. 5 shows the arrangement of FIG. 4 after it has been transformed according to the invention, e.g., by a specially programmed electronic computer.

FIG. 5 shows the transformation which a specially programmed electronic computer performs on the grid formed by lines 18 and 21. Lines 18, 19, 20 and 21 are converted into lines 26, 27, 28 and 29 respectively. These latter lines 26 to 29 embody the principles of the invention illustrated in FIGS. 2 and 3. FIG. 5 also shows the transformation of conductors 23, 24 and 25.

Figure 6:
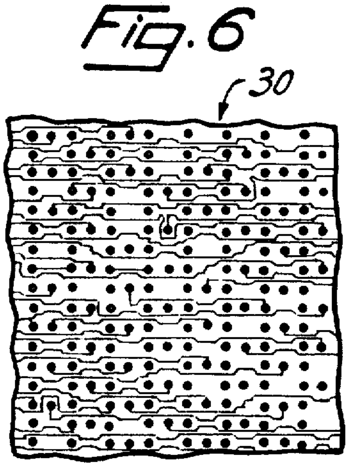
FIGS. 6 and 7 are examples of lay-outs obtained by use of an electronic computer.
Figure 7:
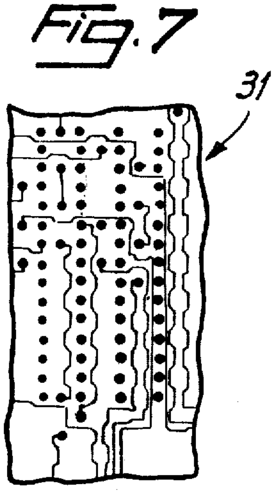

FIGS. 6 and 7 show examples 30 and 31 of conductor lay-outs obtained by a specially programmed electronic computer. In these diagrams the only linking members shown are those which are in active use.

What is claimed is:

1. A device connecting electrical circuits, said device including a plurality of superimposed insulating sheets joined together, at least one face of each of said sheets carrying networks of conductive strips comprising:

a plurality of linking members electrically connecting conductive strips situated at different ones of said sheets;

a plurality of connecting members connecting the conductive strips to electrical circuits;

said linking and said connecting members being arranged in rows and columns defining corridors wherein the connecting members arranged in rows and in columns form a gird having rectangular lattices with the distance between two columns being greater than that between two rows, the linking members arranged in a row with each linking member being disposed between two connecting members and the linking members being situated at every other interval between said connecting members in a row;

two of said conductive strips passing substantially parallel to each other through each of the corridors which are parallel to the rows, each of the two strips having offsets therein with each of said strips being disposed further away from the other strip in the region adjacent to an interval between connecting members which does not contain a linking member in that row, such that the average distance between two adjacent strips along their substantially parallel paths is greater than the distance which would separate them if they were straight.

2. A device connecting electrical circuits, said device including a plurality of superimposed insulating sheets joined together, at least one face of each of said sheets carrying networks of conductive strips comprising:

a plurality of linking members electrically connecting conductive strips situated at different ones of said sheets;

a plurality of connecting members connecting the conductive strips to electrical circuits;

said linking and said connecting members being arranged in rows and columns defining corridors wherein the connecting members arranged in rows and columns forming a grid having rectangular lattices with the distance between two columns being greater than the distance between two rows, the linking members arranged in a row with each linking member being disposed between two connecting members and the linking members being situated at every other interval between said connecting members in a row;

two of said conductive strips passing substantially parallel to each other through each of the corridors which are parallel to the columns, said two strips being arranged with the strip nearer a column of connecting members being straight, and the strip nearer the column of linking members forming an offset in that strip, such that the average distance between two adjacent strips along their substantially parallel path is greater than the distance which would separate them if they were straight.

3. A device according to claim 2 including:

straight conductive strips coupling two consecutive linking members, and the length of said offsets in a direction parallel to said columns is less than the distance separating two linking members.

* * * * *